(12) United States Patent
Fetvedt et al.

(10) Patent No.: US 10,103,737 B2
(45) Date of Patent: Oct. 16, 2018

(54) CONTROL SYSTEMS AND METHODS SUITABLE FOR USE WITH POWER PRODUCTION SYSTEMS AND METHODS

(71) Applicant: 8 Rivers Capital, LLC, Durham, NC (US)

(72) Inventors: Jeremy Eron Fetvedt, Raleigh, NC (US); Rodney John Allam, Wiltshire (GB)

(73) Assignee: 8 Rivers Capital, LLC, Durham, NC (US)

( * ) Notice: Subject to any disclaimer, the term of this patent is extended or adjusted under 35 U.S.C. 154(b) by 383 days.

(21) Appl. No.: 14/938,309

(22) Filed: Nov. 11, 2015

(65) Prior Publication Data
US 2016/0134291 A1    May 12, 2016

Related U.S. Application Data

(60) Provisional application No. 62/078,833, filed on Nov. 12, 2014.

(51) Int. Cl.
*F02C 9/00* (2006.01)
*H03L 5/02* (2006.01)
(Continued)

(52) U.S. Cl.
CPC .......... *H03L 5/02* (2013.01); *F02C 9/00* (2013.01); *F02C 9/24* (2013.01); *F02C 9/26* (2013.01);
(Continued)

(58) Field of Classification Search
None
See application file for complete search history.

(56) References Cited

U.S. PATENT DOCUMENTS

| | | |
|---|---|---|
| 3,369,361 A | 2/1968 | Craig |
| 3,376,706 A | 4/1968 | Angelino |

(Continued)

FOREIGN PATENT DOCUMENTS

| | | |
|---|---|---|
| CN | 1898499 | 1/2007 |
| CN | 101201171 | 6/2008 |

(Continued)

OTHER PUBLICATIONS

Combs, Jr. "An Investigation of the Supercritical CO2 Cycle (Feher Cycle) for Shipboard Application," 1977, *Submitted in Partial Fulfillment of the Requirements for the Degree of Ocean Engineer and the Degree of Master of Science in Mechanical Engineering at the Massachusetts Institute of Technology*, 148.

(Continued)

*Primary Examiner* — Paul Yanchus, III
(74) *Attorney, Agent, or Firm* — Womble Bond Dickinson (US) LLP

(57) ABSTRACT

Control systems and methods suitable for combination with power production systems and methods are provided herein. The control systems and methods may be used with, for example, closed power cycles as well as semi-closed power cycles. The combined control systems and methods and power production systems and methods can provide dynamic control of the power production systems and methods that can be carried out automatically based upon inputs received by controllers and outputs from the controllers to one or more components of the power production systems.

35 Claims, 7 Drawing Sheets

(51) Int. Cl.
  *F02M 59/00* (2006.01)
  *G05B 15/02* (2006.01)
  *F02C 9/24* (2006.01)
  *F02C 9/26* (2006.01)
  *F02C 9/28* (2006.01)

(52) U.S. Cl.
  CPC ............... *F02C 9/28* (2013.01); *F02M 59/00* (2013.01); *G05B 15/02* (2013.01); *F05D 2270/053* (2013.01); *F05D 2270/07* (2013.01); *F05D 2270/303* (2013.01)

(56) References Cited

U.S. PATENT DOCUMENTS

| | | | |
|---|---|---|---|
| 3,503,208 A | 3/1970 | Schmidt | |
| 3,544,291 A | 12/1970 | Schlinger et al. | |
| 3,736,745 A | 6/1973 | Karig | |
| 3,837,788 A | 9/1974 | Craig et al. | |
| 3,868,817 A | 3/1975 | Marion et al. | |
| 3,971,211 A | 7/1976 | Wethe et al. | |
| 3,976,443 A | 8/1976 | Paull et al. | |
| 4,132,065 A | 1/1979 | McGann | |
| 4,154,581 A | 5/1979 | Nack et al. | |
| 4,191,500 A | 3/1980 | Oberg et al. | |
| 4,193,259 A | 3/1980 | Muenger et al. | |
| 4,206,610 A | 6/1980 | Santhanam | |
| 4,434,613 A | 3/1984 | Stahl | |
| 4,498,289 A | 2/1985 | Osgerby | |
| 4,522,628 A | 6/1985 | Savins | |
| 4,602,483 A | 7/1986 | Wilks et al. | |
| 4,702,747 A | 10/1987 | Meyer et al. | |
| 4,721,420 A | 1/1988 | Santhanam et al. | |
| 4,765,143 A | 8/1988 | Crawford et al. | |
| 4,765,781 A | 8/1988 | Wilks et al. | |
| 4,839,030 A | 6/1989 | Comolli et al. | |
| 4,852,996 A | 8/1989 | Knop et al. | |
| 4,881,366 A | 11/1989 | Nurse | |
| 4,957,515 A | 9/1990 | Hegarty | |
| 4,999,992 A | 3/1991 | Nurse | |
| 4,999,995 A | 3/1991 | Nurse | |
| 5,175,995 A | 1/1993 | Pak et al. | |
| 5,247,791 A | 9/1993 | Pak et al. | |
| 5,265,410 A | 11/1993 | Hisatome | |
| 5,345,756 A | 9/1994 | Jahnke et al. | |
| 5,353,721 A | 10/1994 | Mansour et al. | |
| 5,394,686 A | 3/1995 | Child et al. | |
| 5,415,673 A | 5/1995 | Hilton et al. | |
| 5,421,166 A | 6/1995 | Allam et al. | |
| 5,507,141 A | 4/1996 | Stigsson | |
| 5,520,894 A | 5/1996 | Heesink et al. | |
| 5,590,519 A | 1/1997 | Almlöf et al. | |
| 5,595,059 A | 1/1997 | Huber et al. | |
| 5,692,890 A | 12/1997 | Graville | |
| 5,709,077 A | 1/1998 | Beichel | |
| 5,715,673 A | 2/1998 | Beichel | |
| 5,724,805 A | 3/1998 | Golomb et al. | |
| 5,802,840 A | 9/1998 | Wolf | |
| 5,906,806 A | 5/1999 | Clark | |
| 5,937,652 A | 8/1999 | Abdelmalek | |
| 6,024,029 A | 2/2000 | Clark | |
| 6,148,602 A | 11/2000 | Demetri | |
| 6,170,264 B1 | 1/2001 | Viteri et al. | |
| 6,196,000 B1 | 3/2001 | Fassbender | |
| 6,199,364 B1 | 3/2001 | Kendall et al. | |
| 6,202,574 B1 | 3/2001 | Liljedahl et al. | |
| 6,209,307 B1 | 4/2001 | Hartman | |
| 6,260,348 B1 | 7/2001 | Sugishita et al. | |
| 6,263,661 B1 | 7/2001 | Van der Burgt et al. | |
| 6,269,624 B1 | 8/2001 | Frutschi et al. | |
| 6,289,666 B1 | 9/2001 | Ginter | |
| 6,298,664 B1 | 10/2001 | Åsen et al. | |
| 6,333,015 B1 | 12/2001 | Lewis | |
| 6,389,814 B2 | 5/2002 | Viteri et al. | |
| 6,430,916 B2 | 8/2002 | Sugishita et al. | |
| 6,463,738 B1 * | 10/2002 | Pinkerton | F01K 13/02 60/646 |
| 6,532,745 B1 | 3/2003 | Neary | |
| 6,536,205 B2 | 3/2003 | Sugishita et al. | |
| 6,543,214 B2 | 4/2003 | Sasaki et al. | |
| 6,550,234 B2 | 4/2003 | Guillard | |
| 6,598,398 B2 | 7/2003 | Viteri et al. | |
| 6,612,113 B2 | 9/2003 | Guillard | |
| 6,622,470 B2 | 9/2003 | Viteri et al. | |
| 6,629,414 B2 | 10/2003 | Fischer | |
| 6,637,183 B2 | 10/2003 | Viteri et al. | |
| 6,684,643 B2 | 2/2004 | Frutschi | |
| 6,764,530 B2 | 7/2004 | Iijima | |
| 6,775,987 B2 | 8/2004 | Sprouse et al. | |
| 6,802,178 B2 | 10/2004 | Sprouse et al. | |
| 6,820,689 B2 | 11/2004 | Sarada | |
| 6,824,710 B2 | 11/2004 | Viteri et al. | |
| 6,871,502 B2 | 3/2005 | Marin et al. | |
| 6,877,319 B2 | 4/2005 | Linder et al. | |
| 6,877,322 B2 | 4/2005 | Fan | |
| 6,898,936 B1 | 5/2005 | Ochs et al. | |
| 6,910,335 B2 | 6/2005 | Viteri et al. | |
| 6,918,253 B2 | 7/2005 | Fassbender | |
| 6,945,029 B2 | 9/2005 | Viteri | |
| 6,945,052 B2 | 9/2005 | Frutschi et al. | |
| 6,993,912 B2 | 2/2006 | Fischer | |
| 7,007,474 B1 | 3/2006 | Ochs et al. | |
| 7,007,486 B2 | 3/2006 | Sprouse et al. | |
| 7,021,063 B2 | 4/2006 | Viteri | |
| 7,022,168 B2 | 4/2006 | Schimkat et al. | |
| 7,043,920 B2 | 5/2006 | Viteri et al. | |
| 7,074,033 B2 | 7/2006 | Neary | |
| 7,089,743 B2 | 8/2006 | Frutschi et al. | |
| 7,111,463 B2 | 9/2006 | Sprouse et al. | |
| 7,124,589 B2 | 10/2006 | Neary | |
| 7,147,461 B2 | 12/2006 | Neary | |
| 7,191,587 B2 | 3/2007 | Marin et al. | |
| 7,192,569 B2 | 3/2007 | Stewart | |
| 7,281,590 B2 | 10/2007 | Van de Waal | |
| 7,284,362 B2 | 10/2007 | Marin et al. | |
| 7,299,637 B2 | 11/2007 | Becker | |
| 7,303,597 B2 | 12/2007 | Sprouse et al. | |
| 7,328,581 B2 | 2/2008 | Christensen et al. | |
| 7,334,631 B2 | 2/2008 | Kato et al. | |
| 7,360,639 B2 | 4/2008 | Sprouse et al. | |
| 7,363,764 B2 | 4/2008 | Griffin et al. | |
| 7,377,111 B2 | 5/2008 | Agnew | |
| 7,387,197 B2 | 6/2008 | Sprouse et al. | |
| 7,402,188 B2 | 7/2008 | Sprouse | |
| 7,469,544 B2 | 12/2008 | Farhangi | |
| 7,469,781 B2 | 12/2008 | Chataing et al. | |
| 7,516,607 B2 | 4/2009 | Farhangi et al. | |
| 7,516,609 B2 | 4/2009 | Agnew | |
| 7,547,419 B2 | 6/2009 | Sprouse et al. | |
| 7,547,423 B2 | 6/2009 | Sprouse et al. | |
| 7,553,463 B2 | 6/2009 | Zauderer | |
| 7,615,198 B2 | 11/2009 | Sprouse et al. | |
| 7,665,291 B2 | 2/2010 | Anand et al. | |
| 7,717,046 B2 | 5/2010 | Sprouse et al. | |
| 7,722,690 B2 | 5/2010 | Shires et al. | |
| 7,731,783 B2 | 6/2010 | Sprouse et al. | |
| 7,739,874 B2 | 6/2010 | Nigro | |
| 7,740,671 B2 | 6/2010 | Yows et al. | |
| 7,740,672 B2 | 6/2010 | Sprouse | |
| 7,814,975 B2 | 10/2010 | Hagen et al. | |
| 7,826,054 B2 | 11/2010 | Zillmer et al. | |
| 7,827,797 B2 | 11/2010 | Pronske et al. | |
| 7,874,140 B2 | 1/2011 | Fan et al. | |
| 7,882,692 B2 | 2/2011 | Pronske et al. | |
| 7,927,574 B2 | 4/2011 | Stewart | |
| 7,934,383 B2 | 5/2011 | Gutierrez et al. | |
| 7,950,243 B2 | 5/2011 | Gurin | |
| 7,966,829 B2 | 6/2011 | Finkenrath et al. | |
| 8,043,588 B2 | 10/2011 | Hustad et al. | |
| 8,088,196 B2 | 1/2012 | White et al. | |
| 8,109,095 B2 | 2/2012 | Henriksen et al. | |
| 8,220,248 B2 | 7/2012 | Wijmans et al. | |
| 8,596,075 B2 | 12/2013 | Allam et al. | |
| 8,776,532 B2 | 7/2014 | Allam et al. | |

(56) References Cited

U.S. PATENT DOCUMENTS

| | | |
|---|---|---|
| 8,850,789 B2 | 10/2014 | Evulet et al. |
| 8,959,887 B2 | 2/2015 | Allam et al. |
| 8,986,002 B2 | 3/2015 | Palmer et al. |
| 9,068,743 B2 | 6/2015 | Palmer et al. |
| 2002/0134085 A1 | 9/2002 | Frutschi |
| 2003/0131582 A1 | 7/2003 | Anderson et al. |
| 2003/0221409 A1 | 12/2003 | McGowan |
| 2004/0011057 A1 | 1/2004 | Huber |
| 2004/0123601 A1 | 7/2004 | Fan |
| 2004/0134197 A1 | 7/2004 | Marin et al. |
| 2005/0126156 A1 | 6/2005 | Anderson et al. |
| 2006/0242907 A1 | 11/2006 | Sprouse et al. |
| 2007/0180768 A1 | 8/2007 | Briesch et al. |
| 2007/0274876 A1 | 11/2007 | Chiu et al. |
| 2008/0010967 A1 | 1/2008 | Griffin et al. |
| 2008/0104958 A1 | 5/2008 | Finkenrath et al. |
| 2008/0115500 A1 | 5/2008 | MacAdam et al. |
| 2008/0166672 A1 | 7/2008 | Schlote et al. |
| 2008/0168774 A1* | 7/2008 | Drnevich .............. F02C 3/20 60/777 |
| 2008/0187877 A1 | 8/2008 | Fitzsimmons et al. |
| 2008/0190214 A1 | 8/2008 | Ubowski et al. |
| 2008/0309087 A1 | 12/2008 | Evulet et al. |
| 2009/0025390 A1 | 1/2009 | Christensen et al. |
| 2009/0061264 A1 | 3/2009 | Agnew |
| 2009/0130660 A1 | 5/2009 | Faham et al. |
| 2009/0229271 A1 | 9/2009 | Ruyck et al. |
| 2009/0260585 A1 | 10/2009 | Hack et al. |
| 2009/0301054 A1 | 12/2009 | Simpson et al. |
| 2010/0018218 A1 | 1/2010 | Riley et al. |
| 2010/0024378 A1 | 2/2010 | Ackermann et al. |
| 2010/0024381 A1 | 2/2010 | Ackermann et al. |
| 2010/0024433 A1 | 2/2010 | Ackermann et al. |
| 2010/0031668 A1 | 2/2010 | Kepplinger |
| 2010/0077752 A1 | 4/2010 | Papile |
| 2010/0300063 A1 | 12/2010 | Palmer et al. |
| 2010/0326084 A1 | 12/2010 | Anderson et al. |
| 2011/0012773 A1 | 1/2011 | Cunning et al. |
| 2011/0036011 A1 | 2/2011 | Sprouse et al. |
| 2011/0179799 A1 | 7/2011 | Allam et al. |
| 2011/0185701 A1 | 8/2011 | Koda et al. |
| 2011/0233940 A1 | 9/2011 | Aoyama et al. |
| 2011/0239651 A1 | 10/2011 | Aoyama et al. |
| 2012/0067054 A1 | 3/2012 | Palmer et al. |
| 2012/0067056 A1 | 3/2012 | Palmer et al. |
| 2012/0073261 A1 | 3/2012 | Palmer et al. |
| 2012/0237881 A1 | 9/2012 | Allam et al. |
| 2013/0104525 A1 | 5/2013 | Allam et al. |
| 2013/0118145 A1 | 5/2013 | Palmer et al. |
| 2013/0199195 A1 | 8/2013 | Allam et al. |
| 2013/0205746 A1 | 8/2013 | Allam et al. |
| 2013/0213049 A1 | 8/2013 | Allam et al. |
| 2013/0232989 A1* | 9/2013 | Osorio .............. F02C 7/224 60/779 |
| 2014/0000271 A1 | 1/2014 | Mittricker et al. |
| 2014/0053529 A1 | 2/2014 | Allam et al. |
| 2014/0331687 A1 | 11/2014 | Palmer et al. |
| 2015/0020497 A1 | 1/2015 | Iwai et al. |
| 2015/0027099 A1 | 1/2015 | Iwai et al. |
| 2015/0059313 A1 | 3/2015 | Itoh et al. |

FOREIGN PATENT DOCUMENTS

| | | |
|---|---|---|
| CN | 101324203 | 12/2008 |
| CN | 102834670 | 12/2012 |
| CN | 103221640 | 7/2013 |
| JP | 2225905 | 9/1990 |
| JP | 6-26362 | 2/1994 |
| JP | 3110114 | 11/2000 |
| JP | 2000-337107 | 12/2000 |
| JP | 2001-132472 | 5/2001 |
| JP | 3454372 | 10/2003 |
| WO | WO 95/12757 | 5/1995 |
| WO | WO 2009/041617 | 4/2009 |
| WO | WO 2012/003079 | 1/2012 |

OTHER PUBLICATIONS

Dostal et al., "A Supercritical Carbon Dioxide Cycle for Next Generation Nuclear Reactors," 2004, (*Research Paper*) *Advanced Nuclear Power Technology Program at MIT*, 326 pages.

Hong et al., "Analysis of Oxy-Fuel Combustion Power Cycle Utilizing a Pressurized Coal Combustor," *Energy*, Available Online Jun. 21, 2009, pp. 1332-1340, vol. 34, No. 9.

Iantovski et al., "Highly Efficient Zero Emission CO2-Based Power Plant" *Energy Convers. Mgmt*, 1997, Suppl. pp. S141-S146, vol. 38.

Mathieu et al., "Sensitivity Analysis of the MATIANT Cycle", *Energy Conversion & Management*, 1999, pp. 1687-1700, vol. 40.

Wall et al., "A Zero Emission Combustion Power Plant for Enhanced Oil Recovery," *Energy*, 1995, pp. 823-828, vol. 20, No. 8.

Yantovskii et al. , "Computer Exergonomics of Power Plants Without Exhaust Gases," Energy Convers. Mgmt., Publ. 1992, vol. 33, No. 5-8, pp. 405-412.

http://www.graz-cycle.tugraz.at/pdfs/Bolland_Kvamsdal_Boden_Liege.pdf; Boland, "A Thermodynamic Comparison of the Oxy-Fuel Power Cycles Water-Cycle, Graz-Cycle and Matiant-Cycle," *Norwegian University of Science and Technology*, Trondheim, Norway.

http://www2.ulg.ac.be/genienuc/pageco2.htm; Université de Liège, Department of Power Generation, "CO2 Researches".

Allam et al., "High Efficiency and Low Cost of Electricity Generation from Fossil Fuels While Eliminating Atmospheric Emissions, Including Carbon Dioxide," GHGT-11, *Energy Procedia* 00, 2012, pp. 1-12.

\* cited by examiner

CONTROL SYSTEMS AND METHODS SUITABLE FOR USE WITH POWER PRODUCTION SYSTEMS AND METHODS

CROSS-REFERENCE TO RELATED APPLICATIONS

The present application claims priority to U.S. Prov. Pat. App. No. 62/078,833, filed Nov. 12, 2014, the disclosure of which is incorporated herein by reference.

FIELD OF DISCLOSURE

The present disclosure relates to control systems and methods, and more particularly to control systems and methods that can be integrated with power production systems and methods.

BACKGROUND

There is a great need for the development of power systems that can meet increasing consumption needs. While much work is directed to systems that do not utilize combustion of fossil fuels, cost factors and availability of fossil fuels, especially coals and natural gas (as well as waste hydrocarbons, such as residual oil products), drive a continued need for systems configured to combust such fuels, particularly with high efficiency and complete carbon capture. To meet these needs, there is a continued desire for the development of control systems that can provide for precise control of power systems.

SUMMARY OF THE DISCLOSURE

In one or more embodiments, the present disclosure can provide systems and methods useful for controlling one or more aspects of a power production system. The control systems particularly can provide control over one or more of pressure, temperature, flow rate, and stream composition of one or more flow streams in a power production system. The control systems can provide for optimum efficiency of the power production system. The control systems further can provide control over aspects of the power production system, such as start-up of the system, shutdown of the system, change of input stream(s) in the system, change of output stream(s) in the system, handling of operating emergencies related to the system, and any like considerations related to operation of a power production system.

In one or more embodiments, the present disclosure can relate to a control system suitable for use in a power production plant. For example, the power production plant can be a plant burning a fuel (such as a hydrocarbon, particularly a hydrocarbon gas) in substantially pure oxygen in a combustor at a pressure of about 12 MPa or greater with an additional circulating $CO_2$ stream to produce a combined stream of combustion products and circulating $CO_2$. In some embodiments, the power production can be further characterized by one or more of the following points, which can be combined in any number or order.

The combined stream can be passed through a power producing turbine with a discharge pressure of at least 10 bar.

The turbine exhaust can be cooled in an economizer heat exchange to preheat the circulating $CO_2$ stream.

The turbine exhaust can be further cooled to near ambient temperature, and condensed water can be removed.

The $CO_2$ gas stream can be compressed to be at or near the turbine inlet pressure using a gas compressor followed by a dense $CO_2$ pump to form the circulating $CO_2$ stream.

Net $CO_2$ produced in the combustor can be removed at any pressure between the turbine inlet and outlet pressures.

Heat from an external source can be introduced to preheat part of the circulating $CO_2$ stream to a temperature in the range 200° C. to 400° C. in order to reduce the temperature difference between the turbine exhaust and the circulating $CO_2$ stream leaving the economizer heat exchanger to about 50° C. or less.

The fuel gas flow rate can be controlled to provide the required power output from the turbine.

The turbine outlet temperature can be controlled by the speed of the $CO_2$ pump.

The $CO_2$ compressor discharge pressure can be controlled by recycling compressed $CO_2$ flow to the compressor inlet.

The flow rate of net $CO_2$ produced from fuel gas combustion and removed from the system can be used to control the $CO_2$ compressor inlet pressure.

The difference between the temperature of the turbine exhaust entering the economizer heat exchanger and the temperature of the circulating $CO_2$ stream leaving the economizer heat exchanger can be controlled to be at or below 50° C. by controlling the flow rate of a portion of the circulating $CO_2$ stream which is heated by an added heat source.

The flow rate of net liquid water and fuel derived impurities removed from the system can be controlled by the level in the liquid water separator.

The oxygen flow rate can be controlled to maintain a ratio of oxygen to fuel gas flow rate which can result in a defined excess oxygen in the turbine inlet flow to ensure complete fuel gas combustion and oxidation of components in the fuel gas.

The oxygen stream at $CO_2$ compressor inlet pressure can be mixed with a quantity of $CO_2$ from the $CO_2$ compressor inlet to produce an oxidant stream with an oxygen composition of about 15% to about 40% (molar), which can lower the adiabatic flame temperature in the combustor.

The oxidant flow required to produce the required oxygen to fuel gas ratio can be controlled by the speed of the oxidant pump.

The discharge pressure of the oxidant compressor can be controlled by recycling compressed oxidant flow to the compressor inlet.

The inlet pressure of the oxidant compressor can be controlled by the flow rate of diluent $CO_2$ mixed with the oxygen which forms the oxidant stream.

The ratio of oxygen to $CO_2$ in the oxidant stream can be controlled by the flow of oxygen.

The oxygen can be delivered to the power production system at a pressure at least as high as the turbine inlet pressure, and an oxidant stream with an oxygen composition in the range of about 15% to about 40% (molar) can be desired.

The oxygen to fuel gas ratio can be controlled by the oxygen flow.

The oxygen to $CO_2$ ratio in the oxidant flow can be controlled by the flow of diluent $CO_2$ taken from $CO_2$ compressor discharge.

In any of the embodiments discussed herein, the control of one parameter by a second parameter can particularly indicate that the second parameter is measured (e.g., with a sensor) or otherwise monitored or that the second parameter is calculated by a computer based upon additionally provided information, lookup tables, or presumed values, and a controller initiates a control sequence based upon the measured or calculated second parameter so that the first parameter is appropriated adjusted (e.g., by opening or closing of a valve, increasing or decreasing power to a pump, etc.). In other words, the second parameter is used as a trigger for a controller to implement an adjustment to the first parameter.

In one or more embodiments, the present disclosure can provide power production systems that include an integrated control system, which can be configured for automated control of at least one component of the power production system. In particular, the control system can include at least one controller unit configured to receive an input related to a measured parameter of the power production system and configured to provide an output to the at least one component of the power production system subject to the automated control. The power production system and integrated control system can be further defined in relation to one or more of the following statements, which can be combined in any number and order.

The power production system can be configured for heat input via combustion of a fuel.

The power production system can be configured for heat input via a non-combustion heat source.

The power production system can be configured for recycling a stream of $CO_2$.

The power production system can be configured for producing an amount of $CO_2$ that can be optionally withdrawn from the system, such as being input to a pipeline or being utilized for a further purpose, such as enhanced oil recovery.

The power production system can be configured for utilizing a working fluid that is repeatedly compressed, heated, and expanded.

The integrated control system can include a power controller configured to receive an input related to power produced by one or more power producing components of the power production system.

The power controller can be configured to meet one or both of the following requirements: provide an output to a heater component of the power production system to increase or decrease heat production by the heater component; provide an output to a fuel valve to allow more fuel or less fuel into the power production system.

The integrated control system can include a fuel/oxidant ratio controller configured to receive one or both of an input related to fuel flow rate and an input related to oxidant flow rate.

The fuel/oxidant ratio controller can be configured to meet one or both of the following requirements: provide an output to a fuel valve to allow more fuel or less fuel into the power production system; provide an output to an oxidant valve to allow more oxidant or less oxidant into the power production system.

The integrated control system can include a pump controller configured to receive an input related to temperature of an exhaust stream of a turbine in the power production system and to provide an output to a pump upstream from the turbine to increase or decrease flow rate of a stream exiting the pump.

The integrated control system can include a pump suction pressure controller configured to receive an input related to suction pressure on a fluid upstream from a pump in the power production system and to provide an output to a spillback valve that is positioned upstream from the pump.

The pump suction pressure controller is configured to meet one or both of the following requirements: cause more of the fluid or less of the fluid to spill back to a point that is further upstream from the spillback valve; cause more of the fluid or less of the fluid to be removed from the power production system upstream from the pump.

The integrated control system can include a pressure regulation controller configured to receive an input related to pressure of an exhaust stream of a turbine in the power production system and to provide an output to a fluid outlet valve and allow fluid out of the exhaust stream and optionally to provide an output to a fluid inlet valve and allow fluid into the exhaust stream.

The integrated control system can include a water separator controller configured to receive an input related to the amount of water in a separator of the power production system and to provide and output to a water removal valve to allow or disallow removal of water from the separator and maintain the amount of the water in the separator within a defined value.

The integrated control system can include an oxidant pump controller configured to receive an input related to one or both of a mass flow of a fuel and a mass flow of an oxidant in the power production system and calculate a mass flow ratio of the fuel and the oxidant.

The oxidant pump controller can be configured to provide an output to the oxidant pump to change the power of the pump so as to affect the mass flow ratio of the fuel and the oxidant in the power production system.

The integrated control system can include an oxidant pressure controller configured to receive an input related to the pressure of an oxidant stream downstream from an oxidant compressor and to provide an output to an oxidant bypass valve to cause more oxidant or less oxidant to bypass the compressor.

The integrated control system can include an oxidant pressure controller configured to receive an input related to the pressure of an oxidant stream upstream from an oxidant compressor and to provide an output to a recycle fluid valve to cause more recycle fluid or less recycle fluid from the power production system to be added to the oxidant stream upstream from the oxidant compressor. In particular, the recycle fluid can be a substantially pure $CO_2$ stream.

The integrated control system can include a dilution controller configured to receive an input related to one or both of the mass flow of an oxidant and the mass flow of an oxidant diluent stream and to calculate a mass flow ratio of the oxidant and the oxidant diluent.

The dilution controller can be configured to provide an output to an oxidant entry valve to allow more oxidant or less oxidant to enter the power production system so that the mass flow ratio of the oxidant to the oxidant diluent is within a defined range.

The integrated control system can include a compressor suction pressure controller configured to receive an input related to suction pressure of a fluid upstream from a compressor in the power production system and to provide an output to a spillback valve that is positioned downstream from the compressor and that causes more of the fluid or less fluid to spill back to a point that is upstream from the compressor.

The integrated control system can include a pump speed controller configured to receive an input related to suction pressure upstream from the pump and to provide an output to the pump to increase or decrease pump speed.

The integrated control system can include a side flow heat controller configured to receive an input related to a calculated mass flow requirement for a side flow of a high pressure recycle stream in the power production system and to provide an output to a side flow valve to increase or decrease the amount of the high pressure recycle stream in the side flow.

The power production system can comprise: a turbine; a compressor downstream from the turbine and in fluid connection with the turbine; a pump downstream from the compressor and in fluid connection with the compressor; and a heater positioned downstream from the pump and in fluid connection with the pump and positioned upstream from the turbine and in fluid connection with the turbine. Optionally, the power production system can include a recuperator heat exchanger.

In one or more embodiments, the present disclosure can provide methods for automated control of a power production system. In particular, the method can comprise operating a power production system comprising a plurality of components that include: a turbine; a compressor downstream from the turbine and in fluid connection with the turbine; a pump downstream from the compressor and in fluid connection with the compressor; and a heater positioned downstream from the pump and in fluid connection with the pump and positioned upstream from the turbine and in fluid connection with the turbine. Further, operating the power production system can include using one or more controllers integrated with the power production system to receive an input related to a measured parameter of the power production system and provide an output that automatically controls at least one of the plurality of components of the power production system. In further embodiments, the methods can include one or more of the following steps, which can be combined in any number and order.

The output can be based upon a pre-programmed, computerized control algorithm.

The operating can include input of heat via combustion of a fuel.

The operating can include input of heat via a non-combustion heat source.

The operating can include recycling a stream of $CO_2$.

The operating can include producing an amount of $CO_2$ that can be optionally withdrawn from the system, such as being input to a pipeline or being utilized for a further purpose, such as enhanced oil recovery.

The operating can include utilizing a working fluid that is repeatedly compressed, heated, and expanded.

The operating can include using a controller to receive an input related to power produced by the power production system and direct one or both of the following actions: provide an output to the heater to increase or decrease heat production by the heater; provide an output to a fuel valve of the power production system to allow more fuel or less fuel into the power production system.

The operating can include using a controller to receive one or both of an input related to fuel flow rate and an input related to oxidant flow rate and to direct one or both of the following actions: provide an output to a fuel valve of the power production system to allow more fuel or less fuel into the power production system; provide an output to an oxidant valve of the power production system to allow more oxidant or less oxidant into the power production system.

The method operating can include using a controller to receive an input related to temperature of an exhaust stream of the turbine and provide an output to the pump upstream from the turbine to increase or decrease flow rate of a stream exiting the pump.

The operating can include using a controller to receive an input related to suction pressure on a fluid upstream from the pump and provide an output to a spillback valve that is positioned upstream from the pump. In particular, one or both of the following requirements can be met: the controller causes more of the fluid or less of the fluid to spill back to a point that is further upstream from the spillback valve; the controller causes more of the fluid or less of the fluid to be removed from the power production system upstream from the pump.

The operating can include using a controller to receive an input related to pressure of an exhaust stream of the turbine and provide an output to a fluid outlet valve and allow fluid out of the exhaust stream and optionally provide an output to a fluid inlet valve and allow fluid into the exhaust stream.

The operating can include using a controller to receive an input related to the amount of water in a separator included in the power production system and provide and output to a water removal valve to allow or disallow removal of water from the separator and maintain the amount of the water in the separator within a defined value.

The operating can include using a controller to receive an input related to one or both of a mass flow of a fuel and a mass flow of an oxidant introduced to the power production system and calculate a mass flow ratio of the fuel and the oxidant. In particular, the controller can provide an output to an oxidant pump to change the power of the pump so as to affect the mass flow ratio of the fuel and the oxidant in the power production system.

The operating can include using a controller to receive an input related to the pressure of an oxidant stream downstream from an oxidant compressor and provide an output to an oxidant bypass valve to cause more oxidant or less oxidant to bypass the compressor.

The operating can include using a controller to receive an input related to the pressure of an oxidant stream upstream from an oxidant compressor and to provide an output to a recycle fluid valve to cause more recycle fluid or less recycle fluid to be added to the oxidant stream upstream from the oxidant compressor. In particular, the recycle fluid can be a substantially pure $CO_2$ stream.

The operating can include using a controller to receive an input related to one or both of the mass flow of an oxidant and the mass flow of an oxidant diluent stream and to calculate a mass flow ratio of the oxidant and the oxidant diluent. In particular, the controller can be configured to provide an output to an oxidant entry valve to allow more oxidant or less oxidant to enter the power production system so that the mass flow ratio of the oxidant to the oxidant diluent is within a defined range.

The operating can include using a controller to receive an input related to suction pressure of a fluid upstream from the compressor and provide an output to a spillback valve that is positioned downstream from the compressor and that causes more of the fluid or less fluid to spill back to a point that is upstream from the compressor.

The operating can include using a controller to receive an input related to suction pressure upstream from the pump and to provide an output to the pump to increase or decrease pump speed.

The operating can include using a controller to receive an input related to a calculated mass flow requirement for a side flow of a high pressure recycle stream and provide an output to a side flow valve to increase or decrease the amount of the high pressure recycle stream in the side flow.

BRIEF SUMMARY OF THE FIGURES

Figure 1:
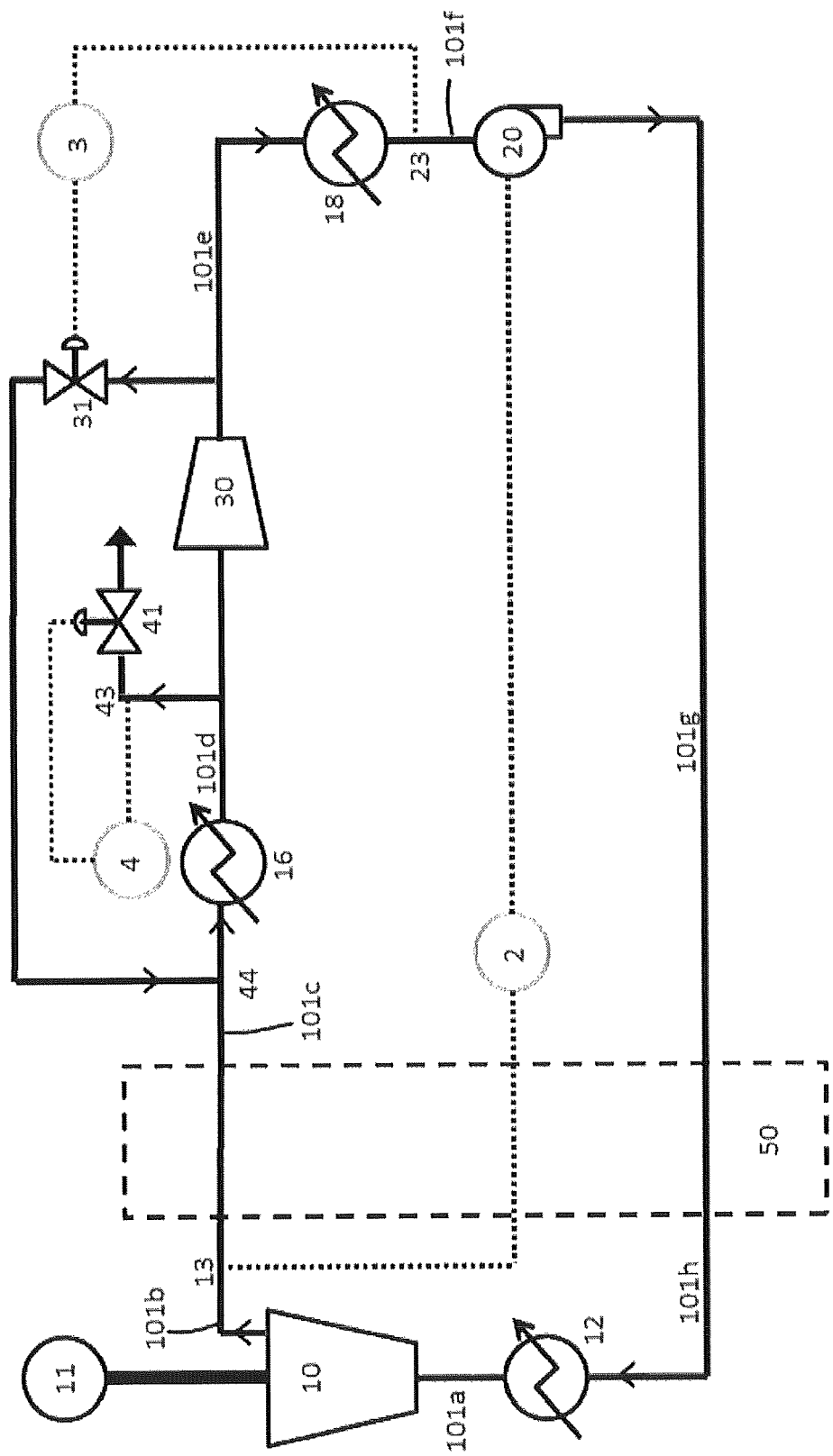
Figure 2:
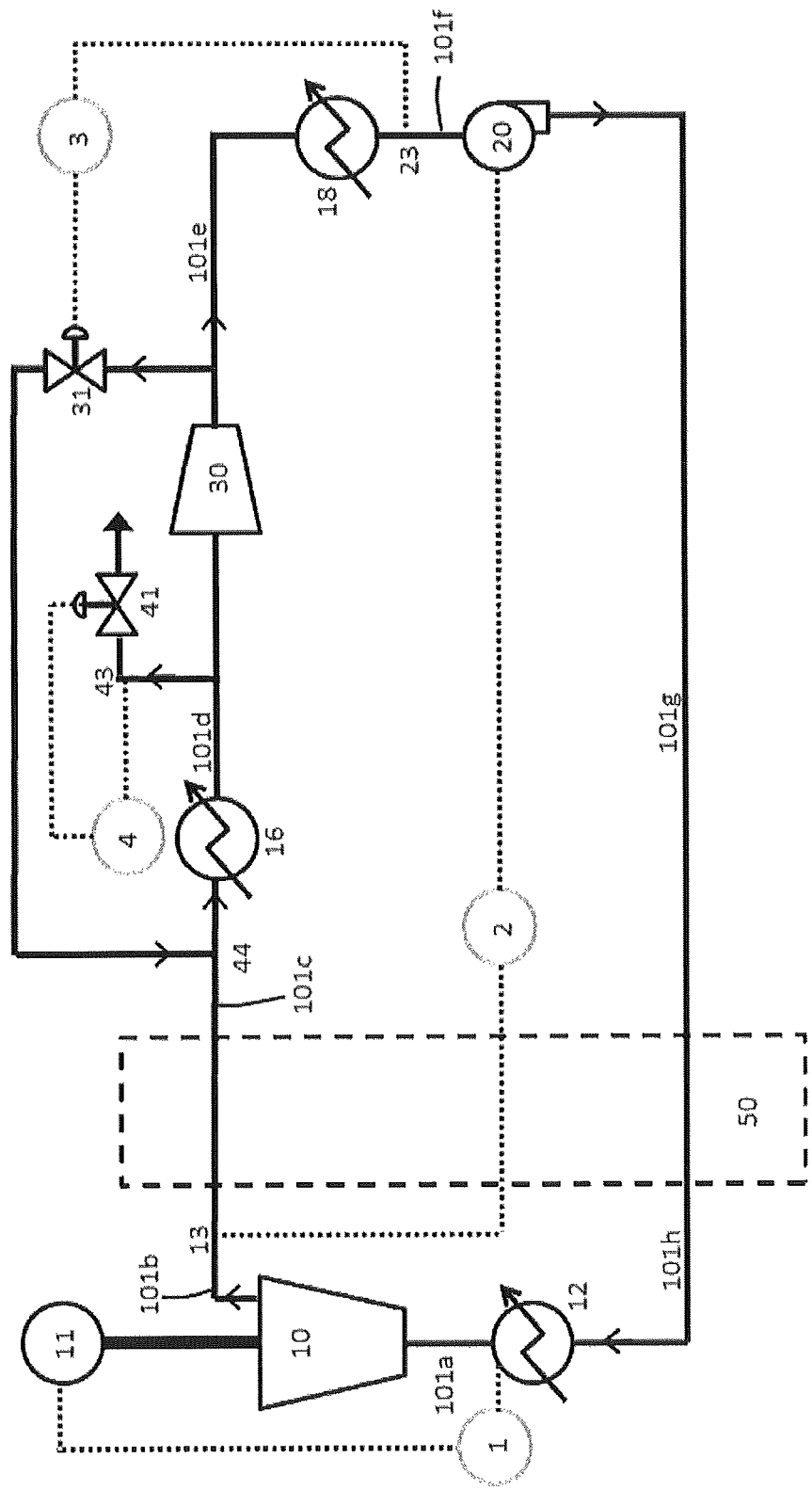
Figure 3:
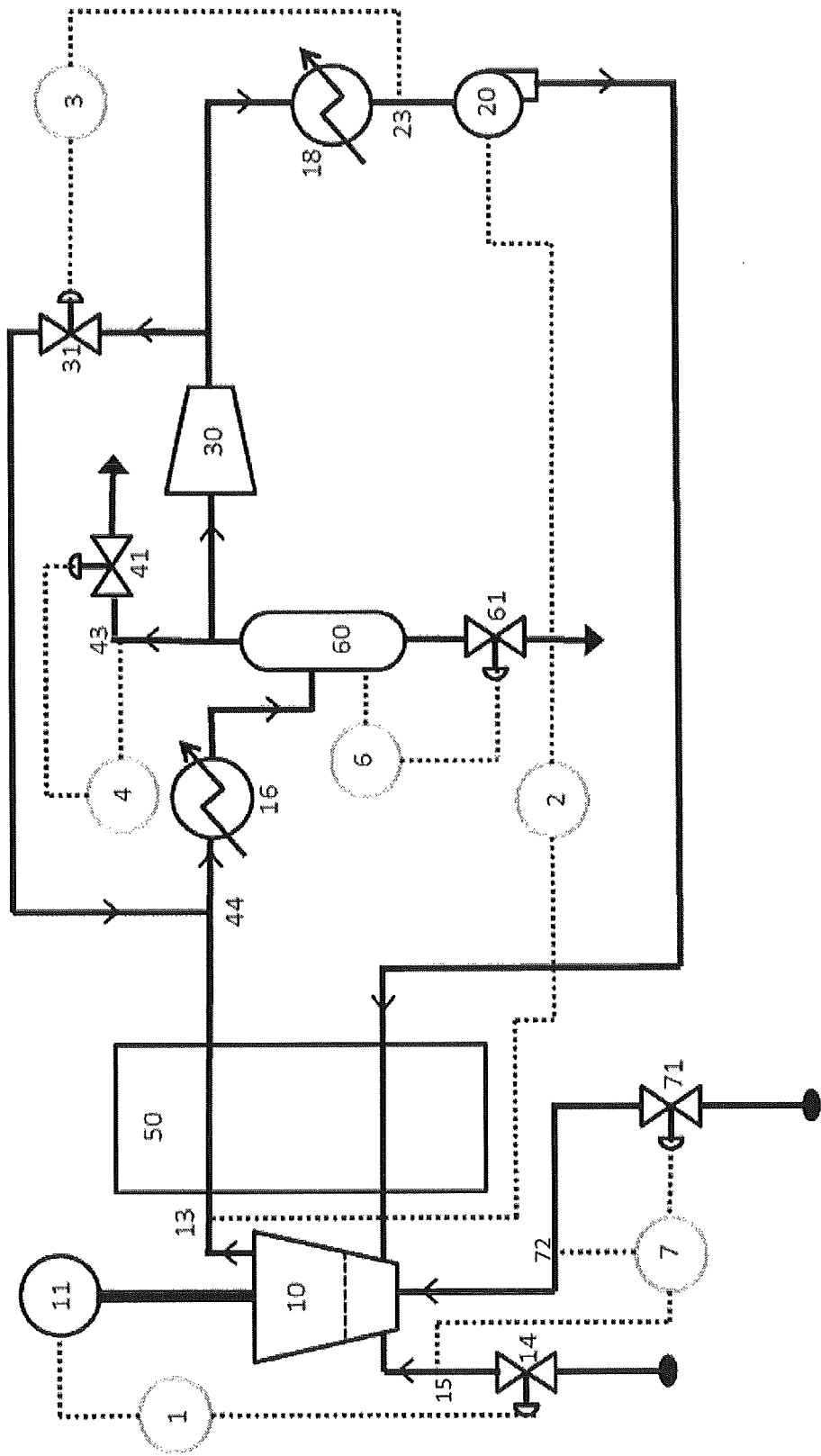
Figure 4:
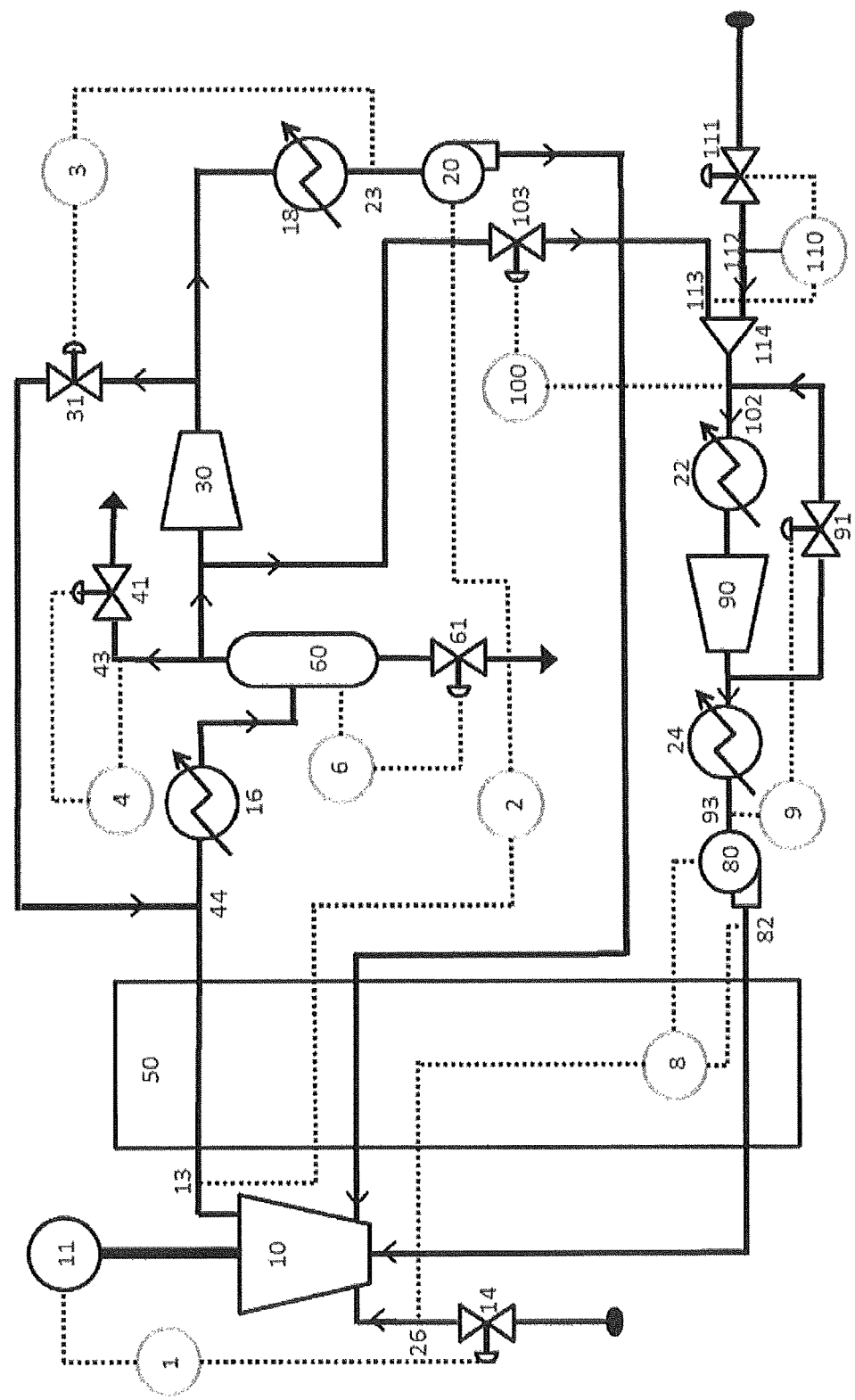
Figure 5:
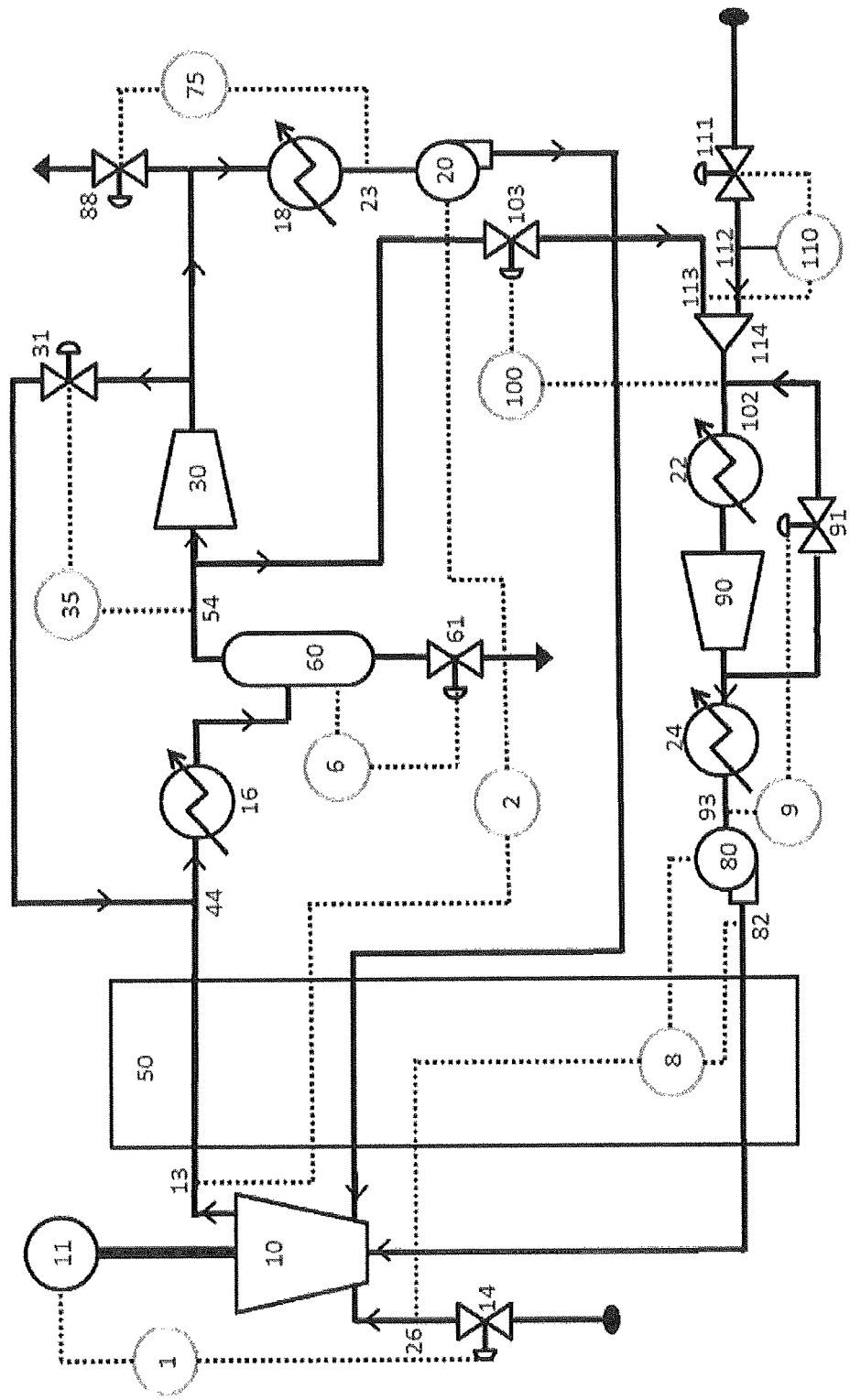
Figure 6:
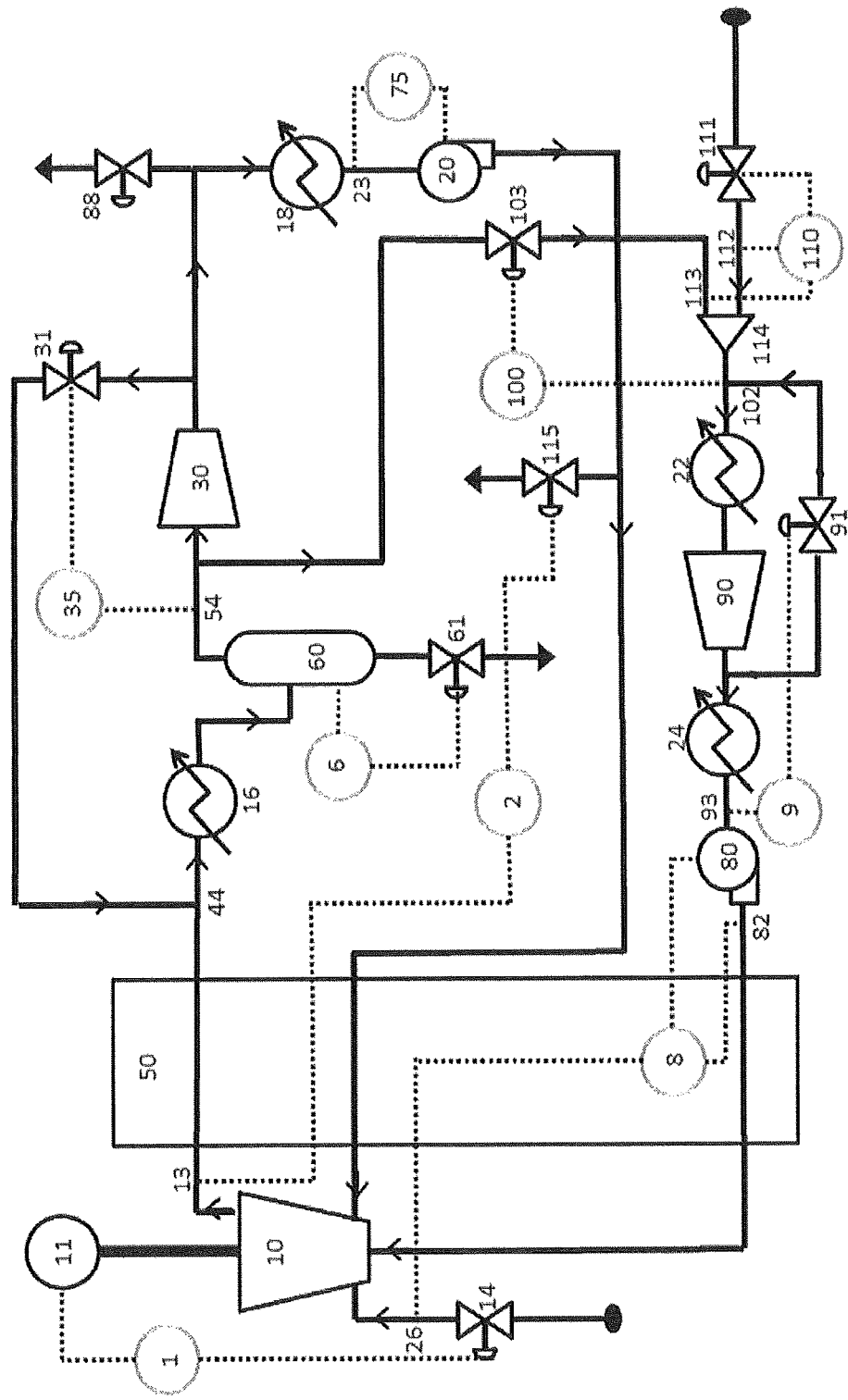
Figure 7:
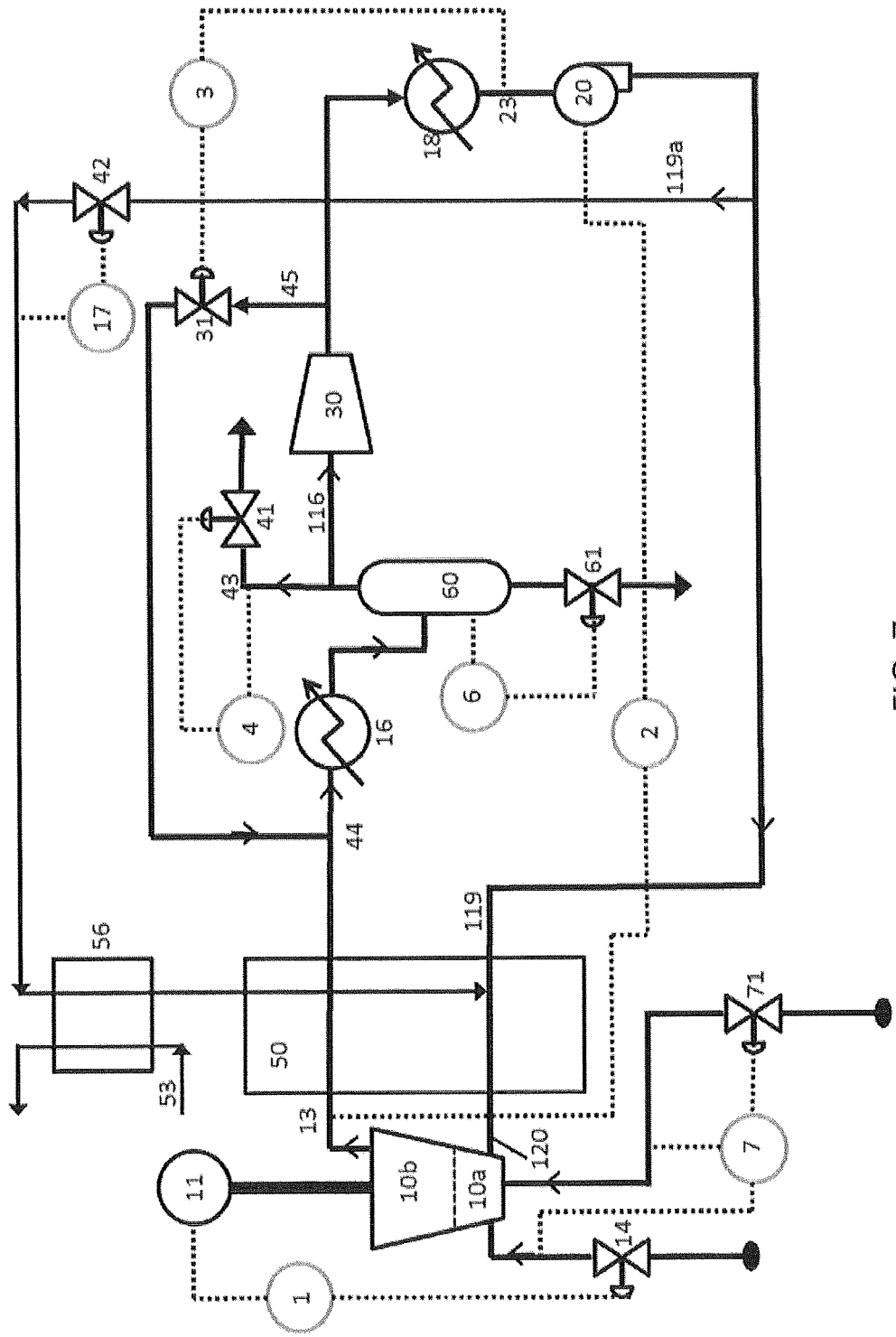

Having thus described the disclosure in the foregoing general terms, reference will now be made to accompanying drawings, which are not necessarily drawn to scale, and wherein:

FIG. 1 is a schematic of a power production system including components of a control system according to embodiments of the present disclosure, said control components being particularly configured for thermal controls;

FIG. 2 is a schematic of a power production system including components of a control system according to further embodiments of the present disclosure, said control components being additionally configured for control over the heat source;

FIG. 3 is a schematic of a power production system including components of a control system according to further embodiments of the present disclosure, said control components being particularly configured for control over elements of a direct fired power production system;

FIG. 4 is a schematic of a power production system including components of a control system according to further embodiments of the present disclosure, said control components being particularly configured for control over further elements of a direct fired power production system;

FIG. 5 is a schematic of a power production system including components of a control system according to further embodiments of the present disclosure, said control components being particularly configured for control over further elements of a direct fired power production system, including removal of excess mass from the power production system;

FIG. 6 is a schematic of a power production system including components of a control system according to further embodiments of the present disclosure, said control components being particularly configured for control over further elements of a direct fired power production system, including removal of excess mass from the power production system; and FIG. 7 is a schematic of a power production system including components of a control system according to further embodiments of the present disclosure, said control components being particularly configured for control over heat input to the power production system.

DETAILED DESCRIPTION

The present invention now will be described more fully hereinafter. This invention may, however, be embodied in many different forms and should not be construed as limited to the embodiments set forth herein; rather, these embodiments are provided so that this disclosure will be thorough and complete, and will fully convey the scope of the invention to those skilled in the art. As used in this specification and the claims, the singular forms "a," "an," and "the" include plural referents unless the context clearly dictates otherwise.

In one or more embodiments, the present disclosure provides systems and methods for control of power production. The control systems and methods can be utilized in relation to a wide variety of power production systems. For example, the control systems can be applied to one or more systems wherein a fuel is combusted to produce heat to a stream that may or may not be pressurized above ambient pressure. The control systems likewise can be applied to one or more systems wherein a working fluid is circulated for being repeatedly heated and cooled and/or for being repeatedly pressurized and expanded. Such working fluid can comprise one or more of $H_2O$, $CO_2$, and $N_2$, for example.

Examples of power production systems and methods wherein a control system as described herein can be implemented are disclosed in U.S. Pat. No. 9,068,743 to Palmer et al., U.S. Pat. No. 9,062,608 to Allam et al., U.S. Pat. No. 8,986,002 to Palmer et al., U.S. Pat. No. 8,959,887 to Allam et al., U.S. Pat. No. 8,869,889 to Palmer et al., U.S. Pat. No. 8,776,532 to Allam et al., and U.S. Pat. No. 8,596,075 to Allam et al, the disclosures of which are incorporated herein by reference. As a non-limiting example, a power production system with which a control system as presently described may be utilized can be configured for combusting a fuel with $O_2$ in the presence of a $CO_2$ circulating fluid in a combustor, preferably wherein the $CO_2$ is introduced at a pressure of at least about 12 MPa and a temperature of at least about 400° C., to provide a combustion product stream comprising $CO_2$, preferably wherein the combustion product stream has a temperature of at least about 800° C. Such power production system further can be characterized by one or more of the following:

The combustion product stream can be expanded across a turbine with a discharge pressure of about 1 MPa or greater to generate power and provide a turbine discharge steam comprising $CO_2$.

The turbine discharge stream can be passed through a heat exchanger unit to provide a cooled discharge stream.

The cooled turbine discharge stream can be processed to remove one or more secondary components other than $CO_2$ to provide a purified discharge stream.

The purified discharge stream can be compressed to provide a supercritical $CO_2$ circulating fluid stream.

The supercritical $CO_2$ circulating fluid stream can be cooled to provide a high density $CO_2$ circulating fluid (preferably wherein the density is at least about 200 kg/m$^3$).

The high density $CO_2$ circulating fluid can be pumped to a pressure suitable for input to the combustor.

The pressurized $CO_2$ circulating fluid can be heated by passing through the heat exchanger unit using heat recuperated from the turbine discharge stream.

All or a portion of the pressurized $CO_2$ circulating fluid can be further heated with heat that is not withdrawn from the turbine discharge stream (preferably wherein the further heating is provided one or more of prior to, during, or after passing through the heat exchanger).

The heated pressurized $CO_2$ circulating fluid can be recycled into the combustor (preferably wherein the temperature of the heated, pressurized $CO_2$ circulating fluid entering the combustor is less than the temperature of the turbine discharge stream by no more than about 50° C.).

The presently disclosed control systems can be particularly useful in relation to power production methods such as exemplified above because of the need for providing precise control over multiple parameters in relation to multiple streams, such parameters needing precise control to provide desired performance and safety. For example, in one or more embodiments, the present control systems can be useful in relation to any one or more of the following functions.

The present control systems can be useful to allow for differential speed control of a power producing turbine and a compressor that is utilized to compress a stream that is ultimately expanded through the turbine. This is an advantage over conventional gas turbines wherein the compressor and the turbine are mounted on the same shaft. This conventional configuration makes it impossible to operate the compressor at a variable speed. Constant rotational speed and inlet conditions yield a substantially constant mass throughput into the compressor and therefore the turbine. This can be affected through the use of inlet guide vanes, which restrict the airflow entering the compressor and thereby lower the mass throughput. According to the present disclosure, the use of a pump between the compressor and the turbine provides for significant levels of control of the power production system. This allows for decoupling of the mass throughput of the compressor-pump train and the shaft speed of the turbine-compressor-generator train.

The present control systems can be useful to control the inlet and/or outlet pressure of a turbine expanding a heated gas stream. The heated gas stream can be predominately $CO_2$ (by mass).

The present control systems can be useful to control an outlet temperature of a turbine.

The present control systems can be useful to control operation of a power production system with a $CO_2$ compression means to raise the $CO_2$ pressure from a turbine exhaust volume to the pressure of a turbine inlet volume so that these pressures are maintained.

The present control systems can be useful to control removal of the net $CO_2$ formed from carbon in a combustor fuel gas at any point in the $CO_2$ compression means from turbine exhaust pressure to turbine inlet pressure.

The present control systems can be useful to control operation of a power production system wherein a hot turbine exhaust is cooled in an economizer heat exchanger while heating a recycle high pressure $CO_2$ stream to ensure the heat recovery from the cooling turbine exhaust provides the optimum flow of heated high pressure $CO_2$ recycle to a combustor at the highest possible temperature.

The present control systems can be useful to optimize heat input to a recycle $CO_2$ stream (for example, at a temperature of about 400° C. or less) from an external heat source to control the temperature difference in an economizer heat exchanger below a temperature of 400° C. to maximize the quantity of recycle $CO_2$ which can be heated against a cooling turbine exhaust stream and minimize the hot end temperature difference of the economizer heat exchanger.

The present control systems can be useful to control the fuel flow to a combustor to ensure that the combustion products when mixed with a high pressure heated recycle $CO_2$ stream form the inlet gas stream to a turbine at the required temperature and pressure.

The present control systems can be useful to control the oxygen flow to a combustor to give a required excess $O_2$ concentration in a turbine outlet stream to ensure complete combustion of a fuel.

The present control systems can be useful to control operation of a power production system so that a turbine exhaust stream leaving an economizer heat exchanger can be further cooled by ambient cooling means to maximize the condensation of water formed in the combustion process and reject the net water production from fuel gas combustion together with other fuel or combustion derived impurities.

In one or more embodiments, a power production suitable for implementation of a control system as described herein can be configured for heating via methods other than through combustion of a fossil fuel. As one non-limiting example, solar power can be used to supplement or replace the heat input derived from the combustion of a fossil fuel in a combustor. Other heating means likewise can be used. In some embodiments, any form of heat input into a $CO_2$ recycle stream at a temperature of 400° C. or less can be used. For example, condensing steam, gas turbine exhaust, adiabatically compressed gas streams, and/or other hot fluid streams which can be above 400° C. may be utilized.

In some embodiments, it can be particularly useful to control a turbine outlet temperature at a maximum value that is fixed by the maximum allowable temperature of an economizer heat exchanger being utilized. Such control can be based on the turbine inlet and outlet pressures and the heat exchanger operating hot end temperature difference.

Control systems of the present disclosure can be defined by one or more functions wherein a parameter (e.g., a measured parameter and/or a calculated parameter) can be linked to one or more executable actions. The executable actions can include one or more actions that regulate a flow of a fluid in the system, such as through opening and closing of one or more valves. As non-limiting examples, measured parameters in a control system according to the present disclosure can include a fluid flow rate, a pressure, a temperature, a liquid level, a fluid volume, a fluid composition, and the like. A measured parameter can be measured using any suitable device, such as thermocouples, pressure sensors, transducers, optical detectors, flow meters, analytical equipment (e.g., UV-VIS spectrometers, IR spectrometers, mass spectrometers, gas chromatographs, high performance liquid chromatographs, and the like), gauges, and similar devices. Calculated parameters in a control system according to the present disclosure can include, for example, power consumption of a compressor (e.g., a $CO_2$ compressor), power consumption of a pump (e.g., a $CO_2$ pump), power consumption of a cryogenic oxygen plant, fuel heat input, a pressure drop (e.g., a pressure drop in a heat exchanger) for one or more fluid streams, a temperature differential (e.g., a temperature difference at a heat exchanger hot end and/or heat exchanger cold end), a turbine power output, a generator power output, and system efficiency. A calculated parameter may be calculated, for example, by a computerized supervisory control system based on measured parameters.

Embodiments of the present disclosure are illustrated in FIG. 1, which illustrates a control system that may be used particularly for a closed power cycle. The control system is particularly useful in systems and methods where direct control over the amount of heat entering the system, for instance in solar applications, is not required. In this configuration, a working fluid is circulated through a heater 12, a turbine 10 connected to a generator 11, a first heater/cooler 16, a compressor 30, a second heater/cooler 18, and a pump 20. Optionally, a recuperator heat exchanger 50 can be included so that heat in working fluid stream 101b exiting turbine 10 can be recuperated into the working fluid stream 101g to exit as working fluid stream 101h that is further heated by the heater 12.

Heat entering the power production system in heater 12 is added to the working fluid, which is preferably as a high pressure (e.g., about 10 bar or greater, about 20 bar or greater, about 50 bar or greater, about 80 bar or greater, about 100 bar or greater, about 150 bar or greater, about 200 bar or greater, or about 250 bar or greater) to provide a high pressure, heated working fluid stream 101a. This stream passes to the turbine 10 and is expanded to a lower pressure to exit as working fluid stream 101b. Parameter check point 13 is configured downstream from the turbine 10 and upstream from the first heater/cooler 16 (and optionally upstream from the recuperator heat exchanger 50 if present) and includes a temperature sensor, thermocouple, or the like. Controller 2 (which can be characterized as a pump controller) directs and/or gathers one or more temperature readings (which readings can be continuous or periodic) at parameter check point 13. So as to maintain a substantially constant temperature at parameter check point 13, controller 2 directs power adjustments as necessary for pump 20. For example, controller 2 can control the speed of pump 20 in response to the temperature reading at parameter check point 13. In this manner, controller 2 can be configured to maintain a desired temperature in working fluid stream 101b independent of the amount of heat that is being introduced into the system in heater 12, and likewise independent of the inlet temperature of turbine 10. This is beneficial in that pump 20 can be specifically controlled to deliver the correct mass flow of working fluid at the correct pressure as dictated by the inlet temperature to the turbine 10 as indicated by the amount of heat introduced in heater 12.

Such dynamic control can affect one or more further parameters in the power production system illustrated in FIG. 1. For example, changes in the flow rate through pump 20 causes changes in the suction pressure immediately upstream from the pump in working fluid stream 101$f$. In order to maintain desired controllability of pump 20, the suction conditions of the pump must remain as constant as possible within the predetermined range. Second heater/cooler 18 can be useful to maintain the suction temperature at pump 20 at a desired value. So as to maintain a substantially constant suction pressure for pump 20, controller 3 (which can be characterized as a pump suction pressure controller) can be configured to monitor a pressure sensor, transducer, or the like positioned at parameter check point 23, and controller 3 can utilize pressure readings taken therefrom to control a spillback valve 31, which can be configured to allow more or less fluid from working fluid stream 101$e$ to spill back to parameter check point 44, which can be at any position in working fluid stream 101$c$. Controller 3 thus essentially can be configured to control the amount of recirculation flow around compressor 30 via the spillback valve 31. As such, pressure at parameter check point 23 can be increased by reducing fluid flow through spillback valve 31 and can be decreased by increasing fluid flow through the spillback valve. As fluid is spilled back into working fluid stream 101$c$, it can also be desirable to maintain a substantially constant pressure in working fluid streams 101$b$ and 101$c$. Accordingly, parameter check point 13 can likewise include a pressure sensor, transducer, or the like. The temperature sensor and the pressure sensor can be configured in the same parameter check point, or different parameter check points can be utilized in working fluid stream 101$b$ for the respective sensors.

Because parameter check point 13 is in fluid communication with parameter check point 44 and parameter check point 43, the respective pressures at points 13, 44, and 43 may differ substantially only due to inherent pressure losses through equipment and piping. Controller 4 can be configured to monitor a pressure sensor, transducer, or the like positioned at parameter check point 43, and controller 4 can be configured to control valve 41 so as to allow fluid from working fluid stream 101$d$ into, or out of, the system in order to maintain a substantially constant pressure at parameter check point 44. As such, parameter check point 44 can include a pressure sensor, transducer, or the like, which can be monitored by controller 4 if desired. Alternatively, because parameter check points 43 and 44 are in fluid communication, the measured pressure at parameter check point 43 can be considered to be substantially identical to the pressure at parameter check point 44. Valve 41 can be configured to remove and/or add fluid to the working fluid stream in order to maintain the desired pressure. In some embodiments, there can be two valves instead of the single valve 41—a first valve (i.e., a fluid outlet valve) configured to allow fluid out to a lower pressure sink, and a second valve (i.e., a fluid inlet valve) configured to allow fluid in from a higher pressure source.

In some embodiments, the illustrated system can be controlled such that valve 41 is either absent or is not utilized, and controller 3 can instead operate to substantially prevent surging by the compressor 30. In such embodiments, controller 2 can still operate to manage temperature at parameter check point 13, and the control look can be a completely closed loop, which configuration can be particularly useful for indirectly heated power production cycles. For example, in one or more embodiments, heater 12 can be configured for provision of solar heating at or above a defined heat level, and the power production system can thus be substantially self-regulating to produce as much power as possible with dynamic response to changes in the solar input. Such configuration could likewise be maintained if additional heat for a further source was continuously or intermittently added in heater 12.

In the illustrated system of FIG. 1, compressor 30 receives its inlet working fluid stream from the turbine 10, and its outlet working fluid stream is delivered ultimately to the pump 20. The compressor 30 can be shaft-mounted on the turbine 10, and the working conditions of the compressor may be substantially unchanged based on the control of the turbine exhaust conditions.

Although controller 2, controller 3, and controller 4 are illustrated and discussed as being separate controllers, it is understood that the respective controllers can be configured as part of a larger unit. For example, a single control unit may include a plurality of subunits that can be individually connected with their designated parameter check points and their controlled devices (e.g., the pump 20, the spillback valve 31, and the valve 41). Moreover, the control units can be configured substantially as subroutines in an overall controller (e.g., a computer or similar electronic device) with a plurality of inputs and a plurality of outputs that are designated for the respective parameter check points and controlled devices.

In embodiments wherein recuperative heat exchanger 50 is included, control of temperature at parameter check point 13 can be particularly important. By maintaining the temperature at parameter check point 13 at or substantially near a steady state value, the temperature profiles in the recuperative heat exchanger 50 can remain substantially constant as well. At a minimum, such control scheme is beneficial because of the reduction or elimination of thermal cycling of the piping, heat exchangers, and other high temperature equipment utilized in the system, which in turn can significantly increase component lifetimes.

Embodiments of the present disclosure are illustrated in FIG. 2, which shows a power production system that is substantially identical to the power production system illustrated in FIG. 1. In the system of FIG. 2, a further controller 1 (which can be characterized as a power controller) is included and can be configured for monitoring a variety of values and directing a number of control commands.

In one or more embodiments, controller 1 can be configured to measure and/or receive measurements in relation to the power output of generator 11. In some embodiments, controller 1 can be configured to direct heat input via heater 12 to generate the required power. Thusly, if power output at generator 11 is above or below the desired output, heat input via heater 12 can be decreased or increased to deliver the desired power output. Similarly, monitoring of power output with controller 1 can enable dynamic changes to the heat input so that a substantially constant power output can be provided. As a non-limiting example, when solar heating is utilized for heater 12, the power output at generator 11 can be utilized as a trigger so that, for example, more mirrors may be aimed at a collection tower to increase heat output when power output drops below a defined level and/or when the power output is insufficient to meet a predefined heating algorithm, such as wherein power output may be automatically increased at a time of day when usage is expected to be increased. As a further non-limiting example, a plurality of heat sources can be utilized wherein a first heat source can be utilized primarily, and a second heat source can be automatically brought online when power output at the generator 11 is insufficient. For example, solar heating may be combined with combustion heating with one being the primary heat source and the other being the secondary heat source to supplement the primary heat source.

As more or less heat is added to the system, the turbine inlet temperature will change and, after expansion through the turbine, the temperature at parameter check point 13 will change. As such, one or more of the control functions described above in relation to FIG. 1 likewise can be implemented in the system as illustrated in FIG. 2.

Embodiments of the present disclosure are further illustrated in FIG. 3, which illustrates a control system that may be used particularly for a semi-closed power cycle. The control system is particularly useful in systems and methods where the cycle is a direct fired oxy-fuel cycle burning a carbonaceous fuel with oxygen. As illustrated at least two components that can be combined to provide an exothermic reaction are introduced to the system through valve 14 and valve 71. The components are shown as being introduced directly to turbine 10; however, in one or more embodiments, the components may be introduced to a reactor, such as a combustor. In some embodiments, turbine 10 is a multi-stage component including a reaction or combustion chamber upstream from a turbine. In FIG. 3, the portion of element 10 below the dashed line can be a combustion chamber, and the portion of element 10 above the dashed line can be a turbine. As a non-limiting example, valve 14 can be configured for metering a fuel, such as natural gas or other fossil fuel, and valve 71 can be configured for metering an oxidant, such as air or substantially pure oxygen (e.g., at least 95%, at least 98%, at least 99%, or at least 99.5% pure oxygen).

In the system exemplified in FIG. 3, controller 1 can be configured to monitor the power output of generator 11. Based upon the measured power output, controller 1 controls fuel valve 14 to allow more fuel or less fuel into the power production system. As more fuel or less fuel is added to the power production system, controller 7 (which can be characterized as a fuel/oxidant ratio controller) compares the fuel flow rate at parameter check point 15 to the oxidant flow rate at parameter check point 72, and controller 7 commands the oxidant valve 71 to allow more oxidant or less oxidant therethrough in order to maintain the prescribed ratio of fuel to oxygen.

Reaction (e.g., combustion) products pass through the turbine 10 (or the turbine section of a combination reactor/turbine) and exit as a turbine exhaust stream. As an example, when natural gas and oxygen are metered through valve 14 and valve 71, the main products in the turbine exhaust stream will be $H_2O$ and $CO_2$. The turbine exhaust stream can pass through a recuperator heat exchanger 50 (although such component is optional) and then pass through the first heater/cooler 16. The turbine exhaust stream is then treated in water separator 60 where water can be taken off through valve 61. A substantially pure $CO_2$ stream exits the top of the separator 60 and is passed through compressor 30 (with a fraction being drawn off through valve 41. A compressed recycle $CO_2$ stream exiting compressor 30 is passed through the second heater/cooler 18 and then pump 20 to provide a high pressure recycle $CO_2$ stream, which can be passed back to the turbine 10 (optionally passing through the recuperator heat exchanger 50 to be heated with heat withdrawn from the turbine exhaust stream). A substantially pure $CO_2$ stream can comprise at least 95% by weight, at least 97% by weight, at least 98% by weight, at least 99% by weight, or at least 99.5% by weight $CO_2$.

As illustrated in FIG. 3, the control system used with the exemplary power production system includes controller 2, controller 3, and controller 4, which can function substantially identically as described above in relation to the systems of FIG. 1 and FIG. 2. In addition, controller 6 (which can be characterized as a water separator controller) is utilized to monitor water level in separator 60, which can include one or more sensors suitable for providing a water level output that can be read by controller 6. Based on the water level signal received, controller 6 can direct valve 61 to open at the correct intervals and durations to maintain the water level in the separator 60 at a desired level. Although measurement is referenced in relation to a water level, it is understood that volume, mass, or other parameters may be utilized to provide the signal to controller 6.

Additional embodiments of the present disclosure are illustrated in FIG. 4, which illustrates a control system that may be used particularly for a semi-closed power cycle utilizing an artificial air source. The control system is particularly useful in systems and methods where the cycle is a direct fired oxy-fuel cycle burning a carbonaceous fuel with oxygen. Controller 1 again monitors the power output of generator 11 and meters fuel input through valve 14 accordingly.

As illustrated in FIG. 4, fuel and oxidant enter the combustion section of dual combustor/turbine 10, and a turbine exhaust stream exits the turbine section. The turbine exhaust stream can pass through a recuperator heat exchanger 50 (although such component is optional) and then pass through the first heater/cooler 16. The turbine exhaust stream is then treated in water separator 60 where water can be taken off through valve 61. A substantially pure $CO_2$ stream exits the top of the separator 60 and is passed through compressor 30 (with a fraction being drawn off through valve 41). A compressed recycle $CO_2$ stream exiting compressor 30 is passed through the second heater/cooler 18 and then pump 20 to provide a high pressure recycle $CO_2$ stream, which can be passed back to the dual combustor/turbine 10 (optionally passing through the recuperator heat exchanger 50 to be heated with heat withdrawn from the turbine exhaust stream).

In this configuration, oxidant enters through valve 111 and passes through union 114, where $CO_2$ can be combined with the oxidant. The oxidant stream (optionally diluted with the $CO_2$ stream) passes through heater/cooler 22, is pressurized in compressor 90, passes through heater/cooler 24, and is finally passed through in pump 80. Controller 8 (which can be characterized as an oxidant pump controller) measures the ratio between the mass flow of the fuel (read at parameter check point 26) and the mass flow of the oxidant (read at parameter check point 82). Based upon the calculated ratio, controller 8 can direct variable speed pump 80 to change the power of the pump and allow the delivery of oxidant in the correct mass flow to maintain the desired oxidant to fuel ratio at the required pressure. In this manner, the amount of oxidant supplied to the power production system is consistently at the correct flow rate and correct pressure for passage into the dual combustor/turbine 10. If, for example, the pressure at parameter check point 82 were to rise due to back pressure from the combustor/turbine 10, controller 8 can be configured to command pump 80 to operate at a different speed suitable to provide the correct pressure and oxidant mass flow. Based upon a pressure reading taken at parameter check point 93, controller 9 (which can be characterized as an oxidant pressure controller) can direct spillback valve 91 to decrease or increase the pressure at parameter check point 93 by allowing more or less fluid to spill back (or be recycled) to a point upstream from the compressor 90 (particularly between union 114 and heater/cooler 22. Pressure likewise can be monitored at parameter check point 102 (which pressure corresponds to the suction of compressor 90). Based upon this pressure, controller 100 (which can be characterized as an oxidant pressure controller) can direct valve 103 to divert none or a portion of the fluid upstream of compressor 30 to union 114 so as to maintain a substantially constant pressure at parameter check point 102. The substantially pure $CO_2$ stream diverted through valve 103 can be utilized to dilute the oxidant, and controller 100 likewise can be configured to increase or decrease flow through valve 103 to provide the desired dilution. Mass flow of the $CO_2$ stream provided through valve 103 can be measured at parameter check point 113, and the mass flow of the oxidant provided through valve 111 can be measured at parameter check point 112. Controller 110 (which can be characterized as a dilution controller) can be configured to calculate the ratio of the flows at check points 112 and 113, and can be configured to direct valve 111 to allow more oxidant or less oxidant to enter the system so as ensure that the correct ratio is maintained.

In one or more embodiments, a control system according to the present disclosure can be configured to specifically provide for mass control across a wide range of pressures. Low pressure mass control (e.g., at ambient pressure to about 10 bar, to about 8 bar, or to about 5 bar) can be achieved similarly to the description of controller 4 above. In particular, controller 4 can be configured to open or close valve 41 to relieve excess mass from the power production system. For example, in a system utilizing a recycle $CO_2$ stream as a working fluid and combusting a fossil fuel, excess $CO_2$ can be formed. To maintain the correct mass balance in the system, all or a portion of the formed $CO_2$ can be drawn off through valve 41. The amount of fluid drawn though valve 41 for purposes of mass control can be calculated based upon the known stoichiometry of the combustion reaction, and controller 4 can be configured to control mass flow through valve 41 accordingly. If desired, one or more sensors can be utilized to measure and/or calculate fluid mass downstream from the combustor and/or to measure and/or calculate fluid mass ratio between a stream between the combustor and the valve 41 in relation to a stream that is downstream from the compressor 30 and/or the pump 20.

In the embodiment illustrated in FIG. 5, controller 3 and controller 4 as described above are absent, and further controllers are provided in order to release the excess mass from the power production system at substantially the same pressure as the outlet pressure of the compressor 30 (which is substantially identical to the suction of pump 20). As described above, the speed of pump 20 is controlled by the exhaust temperature of the turbine 10 via controller 2. In the embodiment exemplified in FIG. 5, however, suction pressure of compressor 30 is controlled. In particular, parameter check point 54 can include a pressure sensor, and controller 35 (which can be characterized as a compressor suction controller) can be configured to open and close valve 31 based upon the pressure at the suction of the compressor 30 as measured at parameter check point 54. If the pressure at parameter check point 54 begins dropping, controller 35 can be configured to open valve 31 and allow fluid to spill back to a point upstream from parameter check point 54 (spillback going to parameter check point 44 in the illustrated embodiment) and raise the pressure at parameter check point 54. If the pressure at parameter check point 54 begins increasing, controller 35 can be configured to close valve 31 so as to reduce the amount of fluid spilling back and lower the pressure at parameter check point 54.

In addition to controlling the speed of pump 20, the suction pressure of the pump can also be controlled. In particular, the pressure read at parameter check point 23 can be utilized by controller 75 (which can be characterized as a pump speed controller), which can be configured to open and close valve 88. Accordingly, the suction pressure of pump 20 is controlled by removing excess fluid from the power production system at valve 88, which in turn provides for maintaining the desired system pressure.

In the embodiment illustrated in FIG. 6, the power control system is configured similarly to the construction illustrated in FIG. 5 but without the use of valve 88. In this illustrated embodiment, the compressor 30 operates on suction pressure control as described in relation to FIG. 5, and pump 20 also operates on suction pressure control. In particular, the pressure read at parameter check point 23 can be utilized by controller 75, which can be configured to adjust the speed of pump 20 to maintain controlled suction conditions and output at correct pressure dictated by the further parameters of the combustion cycle. In addition, temperature taken from parameter check point 13 can again be used by controller 2; however, the controller 2 can be configured to direct flow through valve 115 to control the temperature of the exhaust from turbine 10. By allowing more fluid out of the power production system through valve 115 (or keeping more fluid in the power production system), the inlet pressure (and therefore mass flow) through turbine 10 can be controlled, and the outlet temperature of turbine 10 can be likewise controlled.

In one or more embodiments, a power system shown in FIG. 7 can comprise a turbine 10 coupled to an electric generator 11. A fuel stream is metered through valve 14, and oxygen is metered through valve 71, and the fuel is combusted with the oxygen in combustor 10. The fuel and oxygen are mixed with heated, high pressure recycle $CO_2$ stream 120 leaving the economizer heat exchanger 50. Combustion gases pass to the turbine 10b. The turbine discharge stream is cooled in the economizer heat exchanger 50 against the high pressure recycle $CO_2$ stream 119 and is further cooled to near ambient temperature in the first heater/cooler 16. In some embodiments, the first heater/cooler 16 can be an indirect heat exchanger using for example cooling water or it can be a direct contact heat exchanger which both cools the turbine exhaust stream and condenses water. The near ambient temperature stream enters water separator 60 which discharges the condensed liquid water stream through valve 61. The stream can include fuel or combustion derived impurities which are an oxidized state, such as $SO_2$ and $NO_2$. In the case of a direct contact cooler the unit acts as a combined gas cooler gas/water contactor and liquid phase separator. The recycled $CO_2$ stream 116 enters $CO_2$ recycle compressor 30 where its pressure is raised (e.g., from about 30-70 bar to about 80 bar). The compressor 30 is provided with a recycle $CO_2$ line 45 with a valve 31 to reduce the pressure and return a portion of the compressor flow to the suction at point 44. The net $CO_2$ product, which contains all the carbon derived from the fuel gas stream following oxidation in the turbine combustor, is vented from the compressor as stream through valve 41. The net $CO_2$ product can be delivered at pressure from the compressor suction to the pump discharge. The recycled CO$_2$ stream exiting the compressor 30 is cooled to near ambient temperature in second heater/cooler 18. The density increases to typically about 0.7 kg/liter to about 0.85 kg/liter. The dense supercritical CO$_2$ is pumped to typically 320 bar in a multistage centrifugal pump 20. The recycled CO$_2$ stream 119 exiting pump 20 enters the economizer heat exchanger 50.

A portion 119a of the recycled CO$_2$ stream exiting pump 20 is heated in heat exchanger 56 against a heating stream 53, which can be from any source, such as heat withdrawn from an air separation unit. This stream 119a is heated typically to a temperature of about 200° C. to about 400° C. The heated stream is then passed into the heat exchanger 50 at an intermediate point and remixed with the high pressure recycle CO$_2$ stream 119. The system is controlled by control valves which regulate the fluid flows. The system is provided with sensors which measure flow rates, pressures, temperatures and gas compositions. These measurements can be fed, for example, to a digital control system which regulates the power plant using control algorithms together with stored supervisory control programs. The output from the control system regulates the degree of opening of the control valves plus the speed of the pump 20 and other system functions. The objective is to achieve defined high efficiency operation at any required power output, optimum start-up conditions, controlled ramp rates either up or down, shutdown and responds to system malfunctions. Although such digital control system and control algorithms are mentioned in relation to the system of FIG. 7, it is understood that such disclosure applies equally to any further embodiments described herein, including embodiments described in relation to and of FIG. 1 through FIG. 6 an FIG. 8.

The functional control of the system can be defined by the links between the variables measured by sensors and the response of the particular control valve. One or more embodiments of control systems that can be utilized in relation to any embodiments disclosed herein include the following.

The fuel flow rate through valve 14 can be controlled by the electricity demand imposed on the electric generator 58.

The speed of pump 20 can be used to control its discharge flow rate. In particular, the flow rate set point can be varied to maintain a defined turbine outlet temperature.

The outlet pressure of the CO$_2$ compressor 30 can be maintained at a constant defined value by varying the set point of the compressor recycle flow control valve 31.

Venting of CO$_2$ produced in the power production cycle can be controlled by the flow control valve 41. The set point of this flow controller can be varied to maintain a constant inlet pressure to the CO$_2$ compressor and the turbine discharge. In some embodiments wherein venting through valve 41 takes place at the discharge of compressor 30, the control system can be configured to vary the flow through valve 41 and through the recycle valve 31.

The quantity of recycle high pressure CO$_2$ that is heated by the added heat source in heat exchanger 56 can be controlled by the flow control valve 42 and controller 17 (which can be characterized as a side flow heat controller). The set point of the CO$_2$ flow is controlled to minimize the temperature difference at the hot end of heat exchanger 50 between the high pressure CO$_2$ recycle stream 120 and the turbine exhaust stream at point 13 below 50° C.

The discharge of condensed water together with fuel and combustion derived oxidized impurities can be controlled by maintaining a constant water level in the water separator 60 or in the sump of the alternative direct contact cooler. In the latter case, the excess water is discharged while the main water discharge flow is pumped through a cooling water heat exchanger and introduced into the top of the direct contact cooler above the packing layer.

With reference to FIG. 5, the flow rate of oxygen to the combustor can be controlled by the flow control valve 111. The set point of the flow controller can be varied to maintain a defined ratio of oxygen to fuel gas which will ensure typically 1% excess oxygen above the stoichiometric value to ensure complete fuel combustion plus oxidation of any fuel derived impurities. In order to control the adiabatic flame temperature of the integral turbine combustor, it can be useful to dilute the oxygen with a quantity of CO$_2$ to produce a CO$_2$ plus O$_2$ gas mixture having between 15% and 40%, typically 25% (molar) O$_2$ concentration. The oxygen stream can be diluted with a CO$_2$ stream taken from the inlet line of the CO$_2$ compressor 30. The withdrawn CO$_2$ passes through flow control valve 103 and enters union 114 which, in some embodiments, can be a static mixer. The set point of the flow controller for valve 91 can be adjusted by the supervisory computer program to maintain a constant pressure at point 102. The set point of the oxygen inlet flow control valve 111 can be adjusted to maintain a fixed ratio of oxygen to carbon dioxide flow entering the mixer 114. The mixed oxidant stream passes through heater/cooler 22. The cooled oxidant stream enters the oxidant compressor 90 where it is compressed typically to the range of about 90 bar to about 120 bar pressure. The set point of flow control valve 91 can be varied to control the discharge pressure of the oxidant compressor 90. The oxidant compressor 90 can operate with fixed inlet and outlet pressures. The discharge from compressor 90 can be cooled to near ambient temperature in heater/cooler 24. Its density is increased to the range of, for example, about 0.6 kg/liter to about 0.75 kg/liter. The dense supercritical oxidant stream 82 is pumped to typically 320 bar pressure in the multi-stage centrifugal pump 80. The high pressure discharge stream exiting pump 80 enters the economizer heat exchanger 50 where it is heated by a portion of the heat released from the cooling turbine discharge stream. The flow rate of oxidant can be controlled by adjusting the speed of the oxidant pump 80. The flow rate set point can be adjusted to maintain a defined ratio of oxygen to fuel gas which will provide typically 1% excess oxygen above the quantity required for stoichiometric fuel gas combustion to ensure complete fuel gas combustion plus oxidation of any fuel derived impurities.

Many modifications and other embodiments of the invention will come to mind to one skilled in the art to which this invention pertains having the benefit of the teachings presented in the foregoing description. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A power production system comprising:
   an integrated control system configured for automated control of at least one component of the power production system, the control system including at least one controller unit configured to receive an input related to a measured parameter of the power production system and configured to provide an output to the at least one component of the power production system subject to the automated control;
   a turbine;
   a power producing generator;

a compressor downstream from the turbine and in fluid connection with the turbine;

a pump downstream from the compressor and in fluid connection with the compressor; and a heater positioned downstream from the pump and in fluid connection with the pump and positioned upstream from the turbine and in fluid connection with the turbine;

wherein the integrated control system includes a power controller configured to receive an input related to power produced by the power producing generator and provide an output that is configured to control a heat output by the heater;

wherein the integrated control system includes a pump controller configured to receive an input related to a temperature of an exhaust stream exiting the turbine and provide an output to the pump to control a flow rate of a stream passing from the pump to the heater and thereby control the heat output by the heater; and wherein the integrated control system includes a fuel/oxidant ratio controller configured to receive one or both of an input related to fuel flow rate into the heater and an input related to oxidant flow rate into the heater and provide an output that is configured to control the heat output by the heater.

2. The power production system of claim 1, wherein the power controller is configured to meet one or both of the following requirements:

provide an output to the heater to increase or decrease heat production by the heater;

provide an output to a fuel valve to allow more fuel or less fuel to be passed to the heater.

3. The power production system of claim 1, wherein the fuel/oxidant ratio controller is configured to meet one or both of the following requirements:

provide an output to a fuel valve to allow more fuel or less fuel to be passed to the heater;

provide an output to an oxidant valve to allow more oxidant or less oxidant to be passed to the heater.

4. The power production system of claim 1, wherein the integrated control system includes a pump suction pressure controller configured to receive an input related to suction pressure on a fluid upstream from the pump and to provide an output to a spillback valve that is positioned upstream from the pump.

5. The power production system of claim 4, wherein the pump suction pressure controller is configured to meet one or both of the following requirements:

cause more of the fluid or less of the fluid to spill back to a point that is further upstream from the spillback valve;

cause more of the fluid or less of the fluid to be removed from the power production system upstream from the pump.

6. The power production system of claim 1, wherein the integrated control system includes a pressure regulation controller configured to receive an input related to pressure of the exhaust stream of the turbine and to provide an output to a fluid outlet valve and allow fluid out of the exhaust stream and optionally to provide an output to a fluid inlet valve and allow fluid into the exhaust stream.

7. The power production system of claim 1, wherein the integrated control system includes a water separator controller configured to receive an input related to the amount of water in a separator of the power production system and to provide and output to a water removal valve to allow or disallow removal of water from the separator and maintain the amount of the water in the separator within a defined value.

8. The power production system of claim 1, wherein the integrated control system includes an oxidant pump controller configured to receive an input related to one or both of a mass flow of the fuel and a mass flow of the oxidant in the power production system and calculate a mass flow ratio of the fuel and the oxidant.

9. The power production system of claim 8, wherein the oxidant pump controller is configured to provide an output to the oxidant pump to change the power of the pump so as to affect the mass flow ratio of the fuel and the oxidant in the power production system.

10. The power production system of claim 1, wherein the integrated control system includes an oxidant pressure controller configured to receive an input related to the pressure of an oxidant stream downstream from an oxidant compressor and to provide an output to an oxidant bypass valve to cause more oxidant or less oxidant to bypass the oxidant compressor.

11. The power production system of claim 1, wherein the integrated control system includes an oxidant pressure controller configured to receive an input related to the pressure of an oxidant stream upstream from an oxidant compressor and to provide an output to a recycle fluid valve to cause more recycle fluid or less recycle fluid from the power production system to be added to the oxidant stream upstream from the oxidant compressor.

12. The power production system of claim 11, wherein the recycle fluid is a substantially pure $CO_2$ stream.

13. The power production system of claim 1, wherein the integrated control system includes a dilution controller configured to receive an input related to one or both of the mass flow of the oxidant and the mass flow of an oxidant diluent stream and to calculate a mass flow ratio of the oxidant and the oxidant diluent.

14. The power production system of claim 13, wherein the dilution controller is configured to provide an output to an oxidant entry valve to allow more oxidant or less oxidant to enter the power production system so that the mass flow ratio of the oxidant to the oxidant diluent is within a defined range.

15. The power production system of claim 1, wherein the integrated control system includes a compressor suction pressure controller configured to receive an input related to suction pressure of a fluid upstream from the compressor and to provide an output to a spillback valve that is positioned downstream from the compressor and that causes more of the fluid or less fluid to spill back to a point that is upstream from the compressor.

16. The power production system of claim 1, wherein the integrated control system includes a pump speed controller configured to receive an input related to suction pressure upstream from the pump and to provide an output to the pump to increase or decrease pump speed.

17. The power production system of claim 1, wherein the integrated control system includes a side flow heat controller configured to receive an input related to a calculated mass flow requirement for a side flow of a high pressure recycle stream in the power production system and to provide an output to a side flow valve to increase or decrease the amount of the high pressure recycle stream in the side flow.

18. A method for automated control of a power production system, the method comprising operating a power production system comprising a plurality of components that include:

a turbine;
a power producing generator;
a compressor downstream from the turbine and in fluid connection with the turbine;
a pump downstream from the compressor and in fluid connection with the compressor; and
a heater positioned downstream from the pump and in fluid connection with the pump and positioned upstream from the turbine and in fluid connection with the turbine;
wherein said operating includes using a controller to receive an input related to power produced by the power producing generator and provide an output that is configured to control a heat output by the heater;
wherein said operating includes using a controller to receive one or both of an input related to fuel flow rate into the heater and an input related to oxidant flow rate into the heater and provide an output that is configured to control the heat output by the heater; and
wherein said operating includes using a controller to receive and input related to a temperature of an exhaust stream exiting the turbine and provide an output to the pump to control a flow rate of a stream passing from the pump to the heater and thereby control the heat output by the heater.

19. The method of claim 18, wherein the output is based upon a pre-programmed, computerized control algorithm.

20. The method of claim 18, wherein said using a controller to receive an input related to power produced by the power producing generator and providing an output that is configured to control a heat output by the heater comprises one or both of the following actions:
providing an output to the heater to increase or decrease heat production by the heater;
providing an output to a fuel valve of the power production system to allow more fuel or less fuel to be passed to the heater.

21. The method of claim 18, wherein said using a controller to receive one or both of an input related to fuel flow rate into the heater and an input related to oxidant flow rate into the heater and providing an output that is configured to control the heat output by the heater comprises one or both of the following actions:
providing an output to a fuel valve of the power production system to allow more fuel or less fuel to be passed to the heater;
providing an output to an oxidant valve of the power production system to allow more oxidant or less oxidant to be passed to the heater.

22. The method of claim 18, wherein said operating includes using a controller to receive an input related to suction pressure on a fluid upstream from the pump and provide an output to a spillback valve that is positioned upstream from the pump.

23. The method of claim 22, wherein one or both of the following requirements is met:
the controller causes more of the fluid or less of the fluid to spill back to a point that is further upstream from the spillback valve;
the controller causes more of the fluid or less of the fluid to be removed from the power production system upstream from the pump.

24. The method of claim 18, wherein said operating includes using a controller to receive an input related to pressure of an exhaust stream of the turbine and provide an output to a fluid outlet valve and allow fluid out of the exhaust stream and optionally provide an output to a fluid inlet valve and allow fluid into the exhaust stream.

25. The method of claim 18, wherein said operating includes using a controller to receive an input related to the amount of water in a separator included in the power production system and provide and output to a water removal valve to allow or disallow removal of water from the separator and maintain the amount of the water in the separator within a defined value.

26. The method of claim 18, wherein said operating includes using a controller to receive an input related to one or both of a mass flow of a fuel and a mass flow of an oxidant introduced to the power production system and calculate a mass flow ratio of the fuel and the oxidant.

27. The method of claim 26, wherein the controller provides an output to an oxidant pump to change the power of the pump so as to affect the mass flow ratio of the fuel and the oxidant in the power production system.

28. The method of claim 18, wherein said operating includes using a controller to receive an input related to the pressure of an oxidant stream downstream from an oxidant compressor and provide an output to an oxidant bypass valve to cause more oxidant or less oxidant to bypass the compressor.

29. The method of claim 18, wherein said operating includes using a controller to receive an input related to the pressure of an oxidant stream upstream from an oxidant compressor and to provide an output to a recycle fluid valve to cause more recycle fluid or less recycle fluid to be added to the oxidant stream upstream from the oxidant compressor.

30. The method of claim 29, wherein the recycle fluid is a substantially pure $CO_2$ stream.

31. The method of claim 18, wherein said operating includes using a controller to receive an input related to one or both of the mass flow of an oxidant and the mass flow of an oxidant diluent stream and to calculate a mass flow ratio of the oxidant and the oxidant diluent.

32. The method of claim 31, wherein the controller is configured to provide an output to an oxidant entry valve to allow more oxidant or less oxidant to enter the power production system so that the mass flow ratio of the oxidant to the oxidant diluent is within a defined range.

33. The method of claim 18, wherein said operating includes using a controller to receive an input related to suction pressure of a fluid upstream from the compressor and provide an output to a spillback valve that is positioned downstream from the compressor and that causes more of the fluid or less fluid to spill back to a point that is upstream from the compressor.

34. The method of claim 18, wherein said operating includes using a controller to receive an input related to suction pressure upstream from the pump and to provide an output to the pump to increase or decrease pump speed.

35. The method of claim 18, wherein said operating includes using a controller to receive an input related to a calculated mass flow requirement for a side flow of a high pressure recycle stream and provide an output to a side flow valve to increase or decrease the amount of the high pressure recycle stream in the side flow.

* * * * *